United States Patent [19]
Ashmore, Jr.

[11] Patent Number: 4,862,019
[45] Date of Patent: Aug. 29, 1989

[54] SINGLE-LEVEL POLY PROGRAMMABLE BIT CIRCUIT

[75] Inventor: Benjamin H. Ashmore, Jr., Houston, Tex.

[73] Assignee: Texas Instruments Incorporated, Dallas, Tex.

[21] Appl. No.: 183,958

[22] Filed: Apr. 20, 1988

[51] Int. Cl.[4] .............................................. G11C 11/34
[52] U.S. Cl. .................................... 307/469; 307/450; 307/451; 307/362; 357/23.5; 365/184
[58] Field of Search ............... 307/448, 450, 451, 465, 307/468–469, 579, 585; 357/23.5, 42; 364/716; 365/184–185

[56] References Cited

U.S. PATENT DOCUMENTS

| | | | |
|---|---|---|---|
| 4,228,527 | 10/1980 | Gerber et al. | 357/42 X |
| 4,313,106 | 1/1982 | Hsu | 307/450 X |
| 4,649,520 | 3/1987 | Eitan | 365/184 X |

*Primary Examiner*—David Hudspeth

[57] ABSTRACT

A zero-power bit circuit comprised in part of a pair of single-level poly transistors with opposite impurity-type channels, the pair connected to accomplish the programming function of a floating-gate transistor. The circuit includes three programming/isolating transistors and an inverter-buffer.

12 Claims, 1 Drawing Sheet

SINGLE-LEVEL POLY PROGRAMMABLE BIT CIRCUIT

This application is related to my U.S. patent application Ser. No. 07/183,957, entitled "Integrated Programmable Bit Circuit with Minimal Power Requirement", filed Apr. 20, 1988 and to my U.S. Pat. Application Ser. No. 07/183956, entitled "Integrated Programmable Bit Circuit Using Single-Level Poly Construction", filed Apr. 20, 1988, both applications also assigned to Texas Instruments Incorporated.

BACKGROUND OF THE INVENTION

This invention relates to a bit circuit for use in programmable logic arrays formed on integrated-circuit chips and, in particular, to what is commonly known as a "zero-power" bit circuit formed using complementary-metal-oxide-semiconductor (CMOS) processes.

Known previous attempts at constructing zero-power bit circuits in integrated form have utilized either cross-coupled inverters with stable states skewed by coupling capacitors to the power supplies or have utilized CMOS technology related to electrically-erasable-read-only-memory (EEPROM) devices. Bit circuits using cross-coupled inverters depend upon well-controlled power-up sequences for proper initialization of the circuit at the time the power source is connected and, if the bit setting is disturbed by unwanted transients occurring during operation, resetting of the bit will not occur until the next such power-up sequence is applied to the circuit. Bit circuits formed using EEPROM technology are generally limited to use in circuit designs that have EEPROM capability.

In my pending U.S. Pat. Application Ser. No. 07/183,957, I have described a zero-power bit circuit that is compatible with existing CMOS technology and that requires no special power-up sequence of signals. One element of the bit circuit embodiments described in that patent application is a transistor pair with common floating gates as described in abandoned U.S. Pat. Application No. 065,989 by Howard L. Tigelaar, entitled "Floating Gate Semiconductor Device", filed June 24, 1987 and assigned to Texas Instruments Incorporated. The floating gate to the transistor pair used in the bit circuit of my pending U.S. Pat. Application Ser. No. 07/183,957 requires additional steps of levels of processing during manufacture, as compared to steps of levels of processing using transistors without such floating gates located between gates and channels.

Accordingly, there is a need for a zero-power bit circuit that requires no special power-up sequence of signals and that can be constructed using a single polysilicon gate level process. A bit circuit comprised solely of transistors with single-level polysilicon gates is particularly needed for construction of logic arrays that require relatively few programmable cells and that are otherwise comprised of circuitry that does not require the extra level of processing for fabrication of standard floating-gate transistors.

In my pending U.S. Pat. Application Ser. No. 07/183,956, I have described a zero-power bit circuit that can be constructed solely of transistors with single-level polysilicon gates. The bit circuit of this invention is an alternative to the bit circuit described in that application.

SUMMARY OF THE INVENTION

The zero-power bit circuit of this invention requires no special power-up sequence of signals and can be constructed using single polysilicon gate transistors, thereby avoiding the cost and effort associated with floating-gate construction methods.

The bit circuit described and claimed herein utilizes a P-channel transistor and a N-channel transistor with single-level polysilicon-gates connected to accomplish the function of a floating-gate transistor. An embodiment of the invention is described in which the bit circuit is comprised of as many as three additional transistors for programming and isolating the transistor pair with connected gates and is comprised of an inverter-buffer for furnishing data output at proper voltage levels.

BRIEF DESCRIPTION OF THE DRAWING

The novel features of this invention are set forth in the appended claims. The invention, its features, and its advantages are described below in conjunction with the following drawing:

DETAILED DESCRIPTION OF THE SPECIFIC EMBODIMENT

Figure 1:
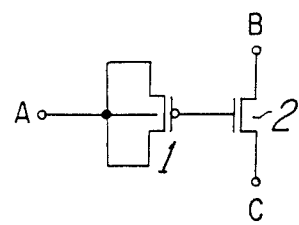
FIG. 1 is a circuit diagram of a CMOS single-level-gate transistor pair connected to perform the function of a floating-gate transistor.

Referring to FIG. 1, programmable transistor pair 1,2 is comprised of P-channel transistor 1 and of N-channel transistor 2. Programmable transistors 1 and 2 are constructed using CMOS construction techniques and have single-level polysilicon gates, which are connected and which float in the circuit.

For the purposes of programming, transistor pair 1,2 of FIG. 1 is preferably constructed by making, for example, the gate-to-channel capacitive area of P-channel transistor 1 much larger than the gate-to-channel capacitive area of N-channel transistor 2. The transistor pair 1,2 is programmed by applying a programming voltage to a source-drain terminal and tank of transistor 1 while isolating and holding the source-drain path of transistor 2 near ground potential. With a larger gate-to-channel capacitance for transistor 1 than for transistor 2, a greater fraction of the applied programming voltage Vpp is applied across gate to source-drain of transistor 2 than across the gate to source-drain of transistor 1. With relatively high programming voltage Vpp applied, N-channel transistor 2 will avalanche in a manner similar to that of a floating-gate transistor and a negative charge will be trapped on the common control gates of transistors 1 and 2.

For purposes of reading of sensing, the source-drain path of transistor 2 will be nonconductive if the common gates of transistor pair 1,2 are charged or programmed and will be conductive if the common gates are uncharged or not programmed.

Figure 2:
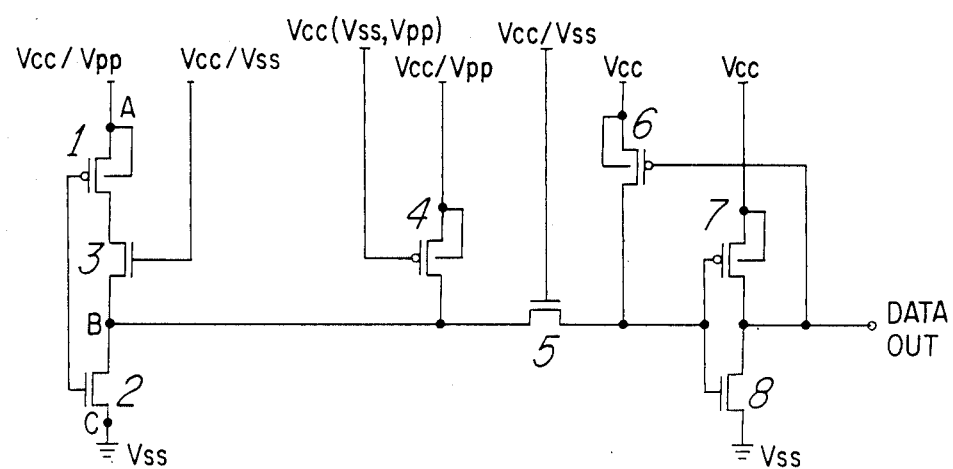
FIG. 2 is a circuit diagram of an embodiment of the zeropower bit circuit of this invention.

Referring to FIG. 2, programmable transistor pair 1,2 functions in the above-described manner similar to that of a floating-gate, avalanche-injection, metal-oxide-semiconductor (FAMOS) transistor. The gate-to-channel capacitance of P-channel transistor 1 is larger than the gate-to-channel capacitance of N-channel transistor 2. The source-drain paths of transistors 1 and 2 are in series with the source-drain path of optional programming/isolating N-channel transistor 3. In particular, the source-drain path of P-channel programming transistor 1 is connected between voltage source Vcc or Vpp and a source-drain terminal of optional programming-/isolating transistor 3. The voltage source is the supply voltage source Vcc during operation and is the higher-potential programming voltage source Vpp during programming or charging of the gates of transistor pair 1,2. The source-drain path of N-channel transistor 2 is connected between the other source-drain terminal of optional programming/isolating transistor 3 and ground or other source Vss of reference potential. The gate of optional programming/isolating transistor is connected to supply voltage source Vcc during operation and to ground or other source Vss of reference potential during programming.

Programming/isolating means 3,4,5 is used to isolate transistor pair 1,2 from other circuitry during read operation, to isolate other circuitry from programming voltages during programming operation, and to transmit the output voltage indicating programmed status of pair 1,2.

Without optional programming/isolating transistor 3, the source-drain paths of the P-channel and N-channel transistor pair 1,2 are connected in series between voltage source Vcc or Vpp and source Vss of reference potential. The output indicating the programmed status of the gates of transistor pair 1,2 is taken from the common source-drain path terminal of transistor pair 1,2.

Referring again to FIG. 2, programming/isolating P-channel transistor 4 has source-drain path connected between supply voltage Vcc and the common source-drain terminal of transistors 2 and 3 during operation. During programming, the supply voltage Vcc is replaced by programming voltage source Vpp. The gate of programming/isolating transistor 4 is connected to supply voltage Vcc during operation and to reference voltage Vss during programming.

Programming/isolating N-channel transistor 5 has sourcedrain path connected between the common source-drain terminal of transistors 2 and 3 and the input to inverter-buffer means 6,7,8. The gate of programming/isolating transistor 5 is connected to supply voltage Vcc during operation and is connected to reference voltage source Vss during programming.

The source-drain path of feedback transistor 6 is connected between supply voltage source Vcc and the input of inverterbuffer means 6,7,8. The gate of transistor 6 is connected to the output DATA OUT of inverter-buffer means 6,7,8, which provides the data output of the zero-power bit circuit of this invention during read or non-programming operation. Inverter 7,8 is comprised of P-channel transistor 7 with source-drain path in series with the source-drain path of N-channel transistor 8 between the supply voltage source Vcc and ground or reference potential source Vss. The gates of transistors 7 and 8 are connected to the input of inverter-buffer 6,7,8 and the common source-drain terminal is connected to circuit output DATA OUT.

During programming of the circuit of FIG. 2, the gates of transistor pair 1,2 are charged by avalanche injection with optional transistor 3 providing isolation during the charging. Transistor 4 serves as a switch for applying programming voltage source Vpp to the source-drain terminal of transistor 2 during programming. The gate of transistor 4 is connected to programming voltage Vpp during programming to inhibit or prevent programming of transistor pair 1,2 and is connected to ground or reference potential Vss to allow or enable programming of transistor pair 1,2. Transistor 5 isolates inverter-buffer 6,7,8 during programming and isolates transistors 1, 2, and 3 during read operation.

If the gates of transistor pair 1,2 have not been charged or programmed, transistor 1 is nonconductive and transistor 2 is conductive during normal read operation. With those conditions the input to inverter-buffer 6,7,8 is low and the output of the bit circuit is at the potential of supply voltage source Vcc.

If the gates of transistor pair 1,2 have been programmed, transistor 1 is conductive and transistor 2 is nonconductive during read operation. With those conditions, the input to inverter-buffer 6,7,8 is high and the output of the bit circuit is at reference potential Vss.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. A zero-power bit circuit comprising:
   a first-impurity-type-channel and a second-impurity-type-channel programmable transistor pair having connected single-level gates and having source-drain paths connected to a source of supply voltage and a source of reference potential during read operation and connected to a source of programming voltage and said source of reference potential during programming operation such that the voltage across one of said programmable transistors indicates the programmed status of said transistor pair,
   a programming/isolating means connected to the source-drain paths of said programmable transistor pair to isolate said source-drain paths during at least programming operation and to provide a signal in response to the programmed status of said transistor pair, and
   an inverter-buffer mans connected to said programming/isolation means and with output comprising the output of said zero-power bit circuit.

2. The zero-power bit circuit of claim 1 in which said sourcedrain path of said first-impurity-type-channel transistor of said transistor pair and the source-drain path of said second-impurity-type-channel transistor of said transistor pair are connected between said supply voltage source and said source of reference potential during read operation and are connected between said programming voltage source and said programming-/isolating means during programming operation and in which the voltage at the common source-drain path terminal of said transistor pair indicates said programmed state of said gates of said transistor pair.

3. The zero-power bit circuit of claim 1 in which the gate-to-channel capacitance of said first-impurity-type-channel transistor of said transistor pair is greater than the gate-to-channel capacitance of said second-impurity-type-channel transistor of said transistor pair.

4. The zero-power bit circuit of claim 2 in which programming/isolating means is comprised of:
   a first-impurity-type-channel transistor with source-drain path connected in between said supply voltage source and said common source-drain path terminal during read operation and connected between said programming voltage source and said common source-drain path terminal during programming operation and with gate connected to said supply voltage source during read operation and connected to one of said programming voltage source and said source of reference potential during programming operation, and a second-impurity-type-channel transistor with source-drain path connected between said common source-drain path terminal and the output of said programming/isolating means and with gate terminal connected to said supply voltage source during read operation and to said source of reference potential during programming operation.

5. The zero-power bit circuit of claim 4 in which said programming/isolating means is also comprised of a second-impurity-type-channel transistor with source-drain path connected in series between the source-drain path of said first-impurity-type-channel programming transistor and the source-drain path of said second-impurity-type-channel programming transistor and with gate connected to said supply voltage source during read operation and to said source of reference potential during programming operation.

6. The zero-power bit circuit of claim 1 in which said inverter-buffer means is comprised of an inverter with a first-impurity-type-channel feedback transistor with source-drain path connected between said supply voltage source and the input of said inverter and with gate terminal connected to the output of said inverter.

7. The zero-power bit circuit of claim 6 in which said inverter is comprised of a first-impurity-type-channel transistor and of a second-impurity-type-channel transistor with source-drain paths connected in series between said supply voltage source and said source of reference potential, with gates connected to said input of said inverter, and with common source-drain terminal connected to the output of said inverter.

8. A zero-power bit circuit comprising:
   a first-impurity-type-channel programmable transistor with source-drain path and tank connected to a supply voltage source during read operation and to a programming voltage source during programming operation,
   a second-impurity-type-channel programmable transistor with source-drain path connected in between said first-impurity-type-channel programmable transistor and a source of reference potential and with gate connected to the gate of said first-impurity-type-channel programmable transistor, and
   a programming/isolating means connected to the common source-drain path terminal of said programmable transistors,
   wherein the voltage across the source-drain path of one of said programmable transistors indicates the programmed state of said gates of said programmable transistors.

9. The zero-power bit circuit of claim 8 in which said programming/isolating means is comprised of:
   a first-impurity-type-channel transistor with source-drain path connected in between said supply voltage source and said common source-drain path terminal during read operation and connected between said programming voltage source and said common source-drain path terminal during programming operation and with gate connected to said supply voltage source during read operation and connected to one of said programming voltage source and said source of reference potential during programming operation, and
   a second-impurity-type-channel transistor with source-drain path connected between said common source-drain path terminal and the output of said programming/isolating means and with gate terminal connected to said supply voltage source during read operation and to said source of reference potential during programming operation.

10. The zero-power bit circuit of claim 9 in which said programming/isolating means is also comprised of a second-impurity-type-channel transistor with source-drain path connected in series between the source-drain path of said second-impurity-type-channel programming transistor and with gate connected to said supply voltage source during read operation and to said source of reference potential during programming operation.

11. The zero-power bit circuit of claim 9 in which the output of said programming/isolating means is connected to an inverter-buffer means.

12. The zero-power bit circuit of claim 9 in which the gate-to-channel capacitance of said first-impurity-type-channel programmable transistor is greater than the gate-to-channel capacitance of said second-impurity-type-channel programmable transistor.

* * * * *